(12) United States Patent
Uchida

(10) Patent No.: US 6,563,137 B2
(45) Date of Patent: May 13, 2003

(54) OPTOELECTRIC INTEGRATED DEVICE HAVING A THREE-DIMENSIONAL SOLID CONFIGURATION

(75) Inventor: Mamoru Uchida, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 109 days.

(21) Appl. No.: 09/817,344

(22) Filed: Mar. 27, 2001

(65) Prior Publication Data

US 2001/0032984 A1 Oct. 25, 2001

(30) Foreign Application Priority Data

Mar. 29, 2000 (JP) .................................... 2000-090826

(51) Int. Cl.$^7$ ................................................ H01L 27/15
(52) U.S. Cl. ............................ 257/84; 257/80; 257/82; 257/86; 257/88; 257/95; 257/103
(58) Field of Search ........................... 257/84, 80, 82, 257/86, 88, 95, 103, 233, 431, 432, 458, 615, 616, 656

(56) References Cited

U.S. PATENT DOCUMENTS 5,701,325 A 12/1997 Ouchi et al. ................ 372/96
6,052,517 A * 4/2000 Matsunaga et al. ..... 395/500.09
6,097,472 A 8/2000 Tanaka et al. ................ 355/47
6,423,974 B1 * 7/2002 Ishikawa et al. ......... 250/370.14

FOREIGN PATENT DOCUMENTS

| JP | 11-54406 | | 2/1999 |
| JP | 11-161766 A | * | 6/1999 |
| JP | 2000-042890 A | * | 2/2000 |
| JP | 2000-332229 | | 11/2000 |

* cited by examiner

Primary Examiner—Nathan J. Flynn
Assistant Examiner—Remmon R. Fordé
(74) Attorney, Agent, or Firm—Fitzpatrick, Cella, Harper & Scinto (57) ABSTRACT

An optoelectric integrated device includes a three-dimensional solid semiconductor crystal, such as a silicon ball, and a plurality of optical devices including a light-emitting device and a light-receiving device integrated on the surface of the semiconductor crystal. Light is emitted and received between the light-emitting device and the light-receiving device through the interior of the semiconductor crystal used as an optical wiring medium.

15 Claims, 6 Drawing Sheets

OPTOELECTRIC INTEGRATED DEVICE HAVING A THREE-DIMENSIONAL SOLID CONFIGURATION

BACKGROUND OF THE INVENTION

1. Field of the Invention

The present invention relates to an optoelectric integrated device in which light-emitting and light-receiving devices are arranged on the surface of a three-dimensional solid semiconductor crystal, such as a ball-shaped silicon (Si) substrate (referred to as a Si ball in this specification). The optoelectric integrated device is typically an optoelectric processing unit which is applicable to a neurocomputer and the like.

2. Related Background Art

One conventional method of rapidly operating a central processing unit (CPU) is to narrow the width of the electric wires used therein and to increase the integration density. This method is, however, accompanied with the pin-bottle-neck problem that the integration density is restricted by the number of electric wires, which drastically increases as the number of devices increases. Several methods for solving this problem have been proposed as follows.

(1) Optical wiring

This method aims to solve the pin-bottle-neck problem by replacing a portion of the electric wiring by optical wiring. The total number of electric wires can be reduced owing to characteristics of non-electromagnetic induction and broad band of the optical wiring. However, when the optical wiring is arranged using conventional optical fiber and semiconductor waveguides, the width of the optical path becomes far thicker than that of electric wires. Accordingly, only a limited portion of the electric wiring can be replaced by optical wiring, and the resultant configuration inevitably lacks flexibility.

The method of an open system (e.g., spatial transmission) has also been proposed. In this case, high density wiring is possible since the degree of freedom of the spatial transmission line itself is large. However, the positional alignment between light-emitting and light-receiving devices is exceedingly complicated, and high density integration is hard to achieve. Thus, the total processing capability becomes smaller than the case where only electric wiring is used.

(2) Si ball with integrated circuit (IC) thereon (ball IC)

The use of a Si ball has been proposed as one solution of the above problem, by a structure that uses only electric wiring. The integration degree per unit volume increases in inverse proportion to the radius of the Si ball since the Si ball uses its spherical surface, whose spatial-use efficiency is larger than that of a conventional planar Si substrate. Further, the wiring length decreases, and accordingly the processing speed is expected to increase due to the effect of integration degree multiplied by the wiring length. This method is, however, not a decisive method from the view point of high speed operation. The reason therefor is that wire width and wire interval decrease as the ball radius decreases, and accordingly adverse influences of high resistance and electromagnetic induction noise rapidly increase.

As described in the foregoing, a method for radically solving the pin-bottle-neck problem and achieving a high speed processing unit has not yet been proposed at present.

SUMMARY OF THE INVENTION

It is an object of the present invention to provide an optoelectric integrated device, such as a processing unit applicable to ultra-high speed operation, ultra-parallel processing and the like, which can solve the above pin-bottleneck problem, and in which optical devices are arranged on the surface of a three-dimensional solid semiconductor crystal and the interior of the semiconductor crystal is used as an optical transmission line.

The present invention is generally directed to an optoelectric integrated device which includes a three-dimensional solid semiconductor crystal, and a plurality of optical devices including a light-emitting device and a light-receiving device integrated on the surface of the semiconductor crystal, and in which light is emitted and received between the light-emitting device and the light-receiving device through the interior of the semiconductor crystal used as an optical wiring medium. The present invention is also generally directed to an optoelectric integrated device which includes a spherical semiconductor, and at least one of a light-emitting device for emitting signal light into the interior of the spherical semiconductor and a light-receiving device for receiving signal light transmitted through the interior of the spherical semiconductor.

In those structures, the solid semiconductor crystal is typically a silicon (Si) crystal on which electronic devices, such as a field effect transistor (FET) and a transistor, can be easily formed monolithically. If adaptable, other semiconductor crystal, such as germanium (Ge), can also be used. The three-dimensional configuration is typically a sphere or ball, but other configurations, such as a cubic one, can also be used. An important feature of the present invention is to construct an optoelectric integrated device in which the interior of a solid semiconductor crystal, such as a Si ball, is used as an optical transmission line and that an optical device (typically, optical devices and IC) is integrated on the surface of the semiconductor crystal.

The optical device can include a portion composed of III-VN semiconductor material, such as GaNAs, GaInNAs, AlNAs, and GaInNAsP, or IV semiconductor material, such as SiGe. In this specification, "III-VN semiconductor material" indicates III-V compound semiconductor material that contains nitrogen (N) as a V material.

On the basis of the above structure, the following more specific structures are possible.

The optical device can be formed on a buffer layer for lattice matching which is formed on the surface of the semiconductor crystal. The buffer layer adjusts or compensates for a difference in lattice constant between the semiconductor crystal and the optical device to secure a crystal growth having a good performance.

The light-emitting device can be constructed such that it emits spontaneous emission light or induced emission light into the interior of the semiconductor crystal. The wavelength of the light is longer than a bandgap wavelength of the semiconductor crystal such that the light cannot be absorbed by the semiconductor crystal.

The light-emitting device can be constructed such that it emits light into the interior of the semiconductor crystal, and one or a plurality of the light-receiving devices can be arranged such that those receive the light emitted by the light-emitting device. The light-emitting device may also be constructed such that it emits spontaneous-emission light or induced-emission light into the exterior of the semiconductor crystal.

The light-receiving device can be arranged such that it receives light emitted into the interior of the semiconductor crystal by one or a plurality of the light-emitting devices. The light-receiving device may also be arranged such that it receives light from the exterior of the semiconductor crystal.

The light-emitting devices can include a light-emitting device which can emit light into the interior of the semiconductor crystal toward a predetermined light-receiving device, and a light-emitting device which can emit light into the interior of the semiconductor crystal toward a plurality of predetermined light-receiving devices. Thereby, flexible wiring can be constructed with high integration.

The optical devices and an electronic device can be integrated on the surface of the semiconductor crystal, and the electronic device has at least one function of switching on and off the light-emitting device, converting light received by the light-receiving device into an electric signal, and performing arithmetic and logical operations on the basis of the electric signal.

As described above, therefore, the interior of a solid semiconductor crystal is used as an optical path for optical interconnect.

In a typical structure, the wiring for electric connection is formed on the surface of a Si ball with one or more IC's thereon (a ball IC), and the interior of the ball IC is used as an optical interconnect path. In such a structure, a light-emitting device formed on the Si ball needs to have a wavelength band which cannot be absorbed by Si. Further, optical devices need to operate in the same environment as Si.

In the preferred embodiments of the present invention, the above requirements are typically satisfied by a structure in which the light-emitting device is composed of III-VN semiconductor material, and the light-receiving device is composed of III-VN semiconductor material or SiGe. The III-VN semiconductor material represented by $GaN_xAs_{1-x}$ lattice-matches to Si when x is approximately equal to 0.2. When x is approximately equal to 0.03, an active layer composed thereof can emit light at a wavelength of about 1.3 $\mu$m which cannot be absorbed by Si. Further, highly-efficient light emitting diodes (LED) and surface emitting lasers (such as a vertical cavity surface emitting laser (VCSEL)) can be constructed since a multi-layer film of GaNAs/AlNAs can be used as a highly-reflective mirror.

The light-receiving device can also be fabricated by substantially the same construction. Further, the light-receiving device can be more easily fabricated by using Si/Ge. The light-emitting device, such as LEDs, formed on the semiconductor crystal can radiate light into the interior thereof, and have all the light-receiving devices, such as photodiodes (PDs), receive the emitted light. Thus, the interior of the semiconductor crystal can be used as a three-dimensional optical transmission path. When a laser diode (LD) with a sharp directivity factor is used as a light source, light emitted thereby can be transferred to a predetermined light-receiving device.

The light source and the light-receiving device can be controlled by the electronic circuit arranged nearby. The electronic circuit arranged near the light-receiving device can not only convert light into an electric signal but also include an arithmetic and logic circuit capable of performing a desired processing therein. A signal received by the light-receiving device can be processed by ICs in its neighborhood. The processed result can be transmitted through the electric wiring formed on the surface of the semiconductor crystal, or newly transmitted toward the interior of the semiconductor crystal as an optical signal. A final processed result can be supplied to the exterior of the semiconductor crystal as an electric signal or optical signal.

These and other advantages will be more readily understood in connection with the following detailed description of the more preferred embodiments in conjunction with the drawings.

DESCRIPTION OF THE PREFERRED EMBODIMENTS

First Embodiment

A first embodiment is directed to an optoelectric integrated device in which light emitting diodes (LEDs) and photodiodes (PDs) are arranged in a ball integrated circuit on a Si ball (a ball IC). Active layers of those devices are chiefly composed of GaInNAs.

Figure 1:
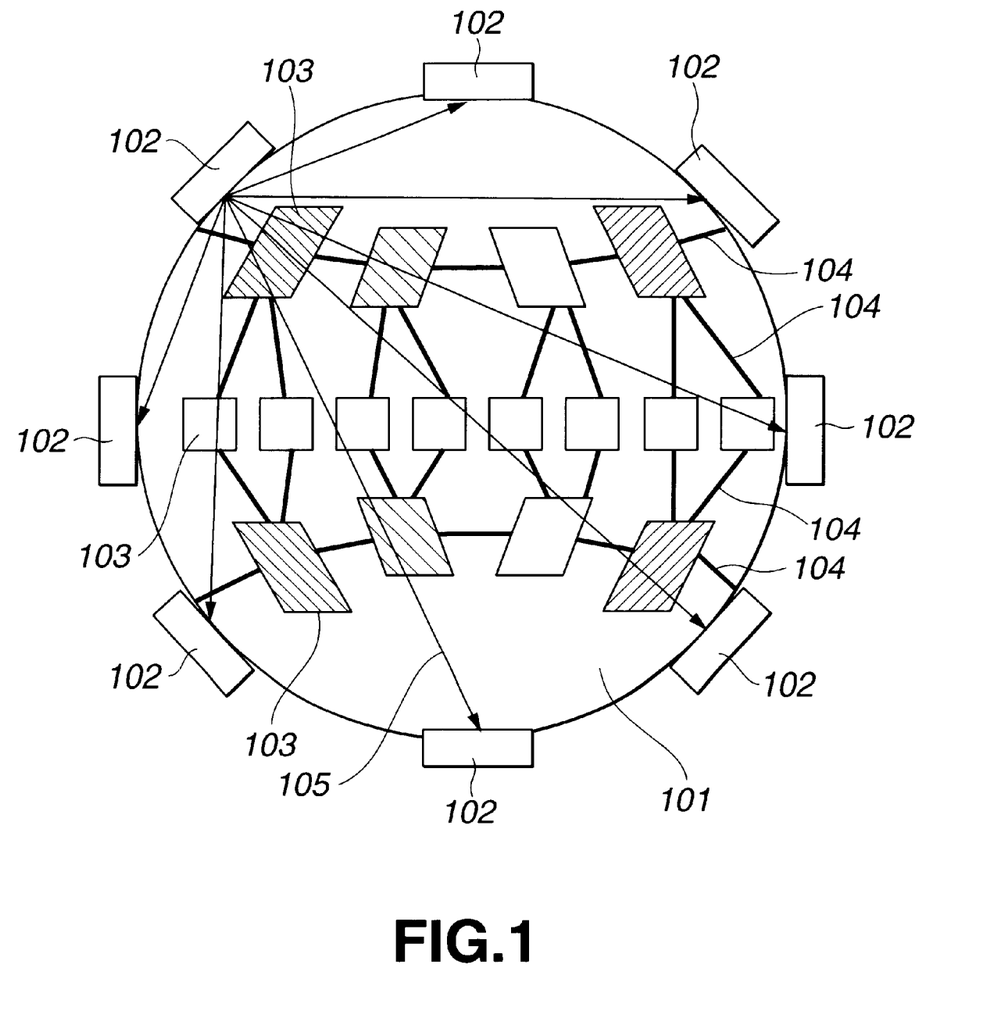
FIG. 1 is a view illustrating the entire structure of a first embodiment of an optoelectric integrated device according to the present invention.

FIG. 1 illustrates the first embodiment. In FIG. 1, optical devices 102, such as a LED and a PD, and electronic devices 103, such as a complementary metal-oxide semiconductor (CMOS) logic, are formed on a spherical Si ball 101 having a diameter of about 1 mm. Those devices 102 and 103 are connected to each other by electric wires 104 of material, such as aluminum (Al), arranged on the surface of the Si ball 101. Light emitted from LED 102 is transmitted through an optical wiring or path 105 in the Si ball 101, and received by the PD 102.

The first embodiment is fabricated in the following manner.

The ball IC can be fabricated by a method identical with that disclosed in a conventional proposal, for example, as follows.

Initially, the Si ball 101 is formed. Particles of polycrystalline Si are put in a pipe with a diameter of 2 mm, and fused. A spherical Si single crystal is thus formed. The surface of the Si single crystal is then polished in a manner similar to that for forming a ball bearing. A truly-spherical Si single crystal with a diameter of 1 mm is thus obtained.

Figure 2:
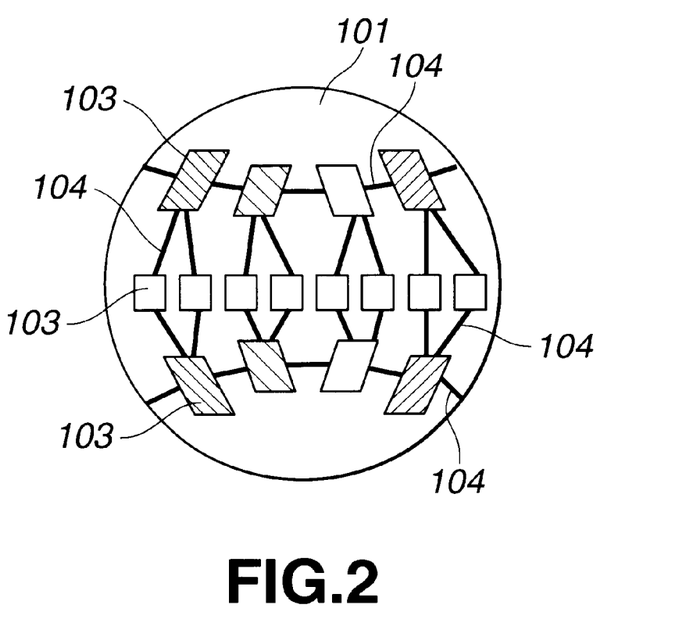
FIG. 2 is a view illustrating the first embodiment at the fabrication stage at which IC and electric wiring are formed on a Si ball.

The Si ball 101 is passed through an integrated circuit (IC) process pipe, and subjected to oxidation and diffusion processes. Patterning is conducted on the processed Si ball 101 by a method disclosed in U.S. Pat. No. 6,097,472, or Japanese Patent Application Laid-Open No. 11(1999)-54406, for example. In the former method, a circuit pattern corresponding to a spherical surface of Si spherical material is prepared, and the circuit pattern is entirely exposed on more than half of the entire sphere. In the latter method, an axis passing through the center of a spherical IC is initially determined. While the spherical IC is intermittently rotated about the axis, an exposure region of the spherical IC surface corresponding to the rotation angle is exposed using a mask corresponding thereto. A Si ball IC is thus completed (see FIG. 2).

Figure 3:
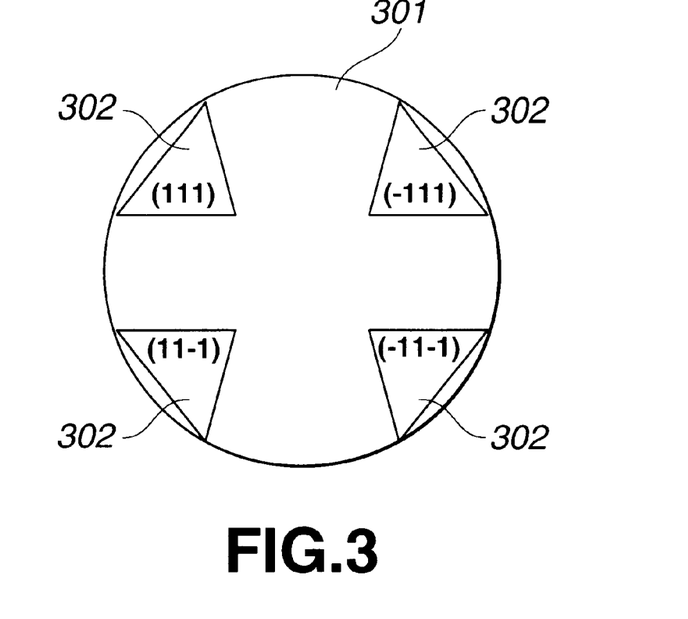
FIG. 3 is a view illustrating the first embodiment at the fabrication stage at which the Si ball with IC and electric wiring formed thereon is covered with a nitride layer and a flat portion for forming an optical device thereon is formed by polishing.

After the process of the Si ball IC is completed, optical devices are formed. The Si ball 101 is entirely covered with a nitride layer 301 or the like, and flat portions 302 for forming an optical device thereon with a size of about 10 µm are formed by abrasion and polishing (see FIG. 3). The Si ball 101 is covered with the nitride layer 301 to protect the electronic devices 103 and electric wiring 104 during a growth process of the optical device, and the nitride layer 301 also serves as a mask for selective growth. Here, the (111) face and its equivalent faces 302 (in total, eight faces) are used as illustrated in FIG. 3. FIG. 3 shows a half of the Si ball 101.

Figure 4:
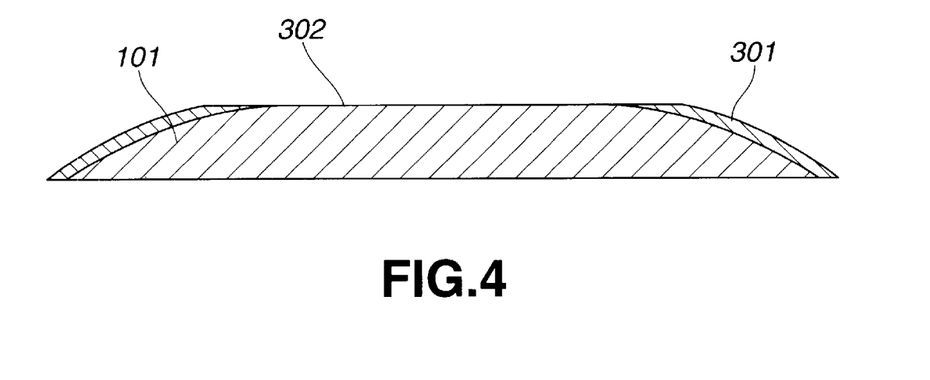
FIG. 4 is a cross-sectional view illustrating the flat portion of the Si ball in the first embodiment.

If necessary, the entire structure may be covered again with a nitride layer or the like, and a window is then opened only on a device fabrication region. In this embodiment, a circular opening is formed, since the selective growth of the optical device proceeds in accordance with the shape of the opening. FIG. 4 illustrates a cross-section of the Si ball 101, particularly the optical device fabrication region, obtained after such a process.

Crystal growth of the optical device will be described. Such technology as that disclosed in Japanese Patent Application Laid-Open No. 12(2000)-332229 can be used for the crystal growth of the optical device. In this crystal growth technology, a mask for selective growth is formed on a Si wafer with a (100) face, on which the electronic device is formed. Then, after a thin layer of a first III-V material (e.g., III-VN material) with a lattice constant different from or approximately equal to that of Si is grown, multiple thin layers of a second III-VN material with a lattice constant longer than the first III-V material and a third III-VN material with a lattice constant shorter than the first III-V material are laid down on the first III-V material while strain compensation is achieved. In the meantime, a fourth III-VN material crystal with a lattice constant approximately equal to that of the first III-V material is selectively grown on the mask for selective growth by a growth in a lateral direction. An optical device of compound semiconductor is then formed on the fourth III-VN material crystal.

In the first embodiment, crystal is grown in the following manner. A buffer layer of $GaN_xAs_{1-x}$ is laid down only on the face 302 equivalent to the (111) face, using gas source molecular beam epitaxy (MBE) or metal organic chemical vapor deposition (MOCVD). Here, the nitrogen (N) mole fraction x is gradually changed from 0.2 to 0 such that the buffer layer can be lattice-matched to GaAs. After that, a LED structure or VCSEL structure with an active layer of GaInNAs/GaAs is fabricated on the buffer layer. An example of the LED will be described.

Figure 5:
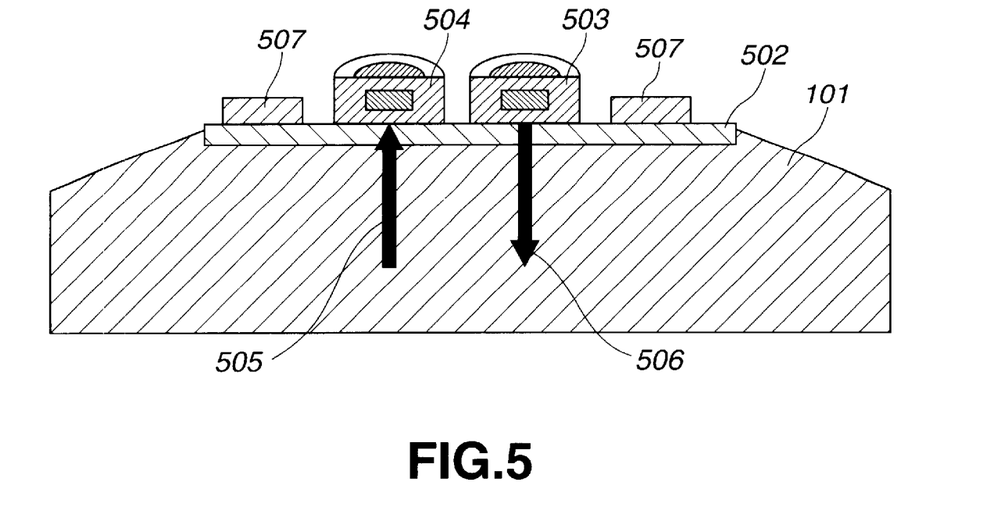
FIG. 5 is a cross-sectional view illustrating the first embodiment at the fabrication stage at which optical devices are fabricated on the flat portion of the Si ball.
Figure 6:
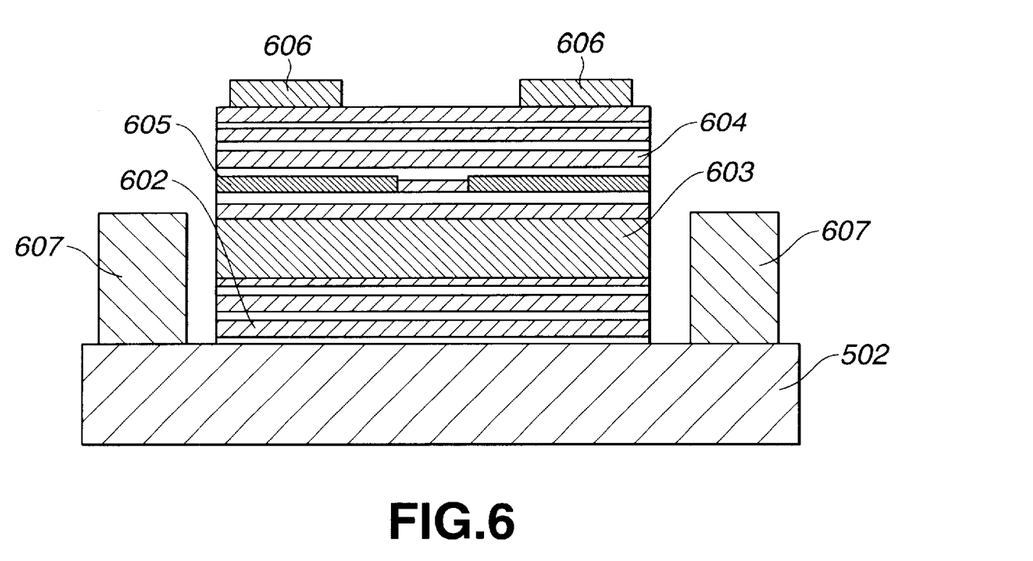
FIG. 6 is a cross-sectional view illustrating a light emitting diode (LED) fabricated on the flat portion of the Si ball.

In FIG. 5, buffer layer 502, LED 503, pin-PD 504 and electrode pads 507 are formed on the Si ball 101. The PD 504 receives light 505, and the LED 503 emits light 506. FIG. 6 illustrates an enlarged view of the LED 503.

N-type GaAs/AlAs reflective layer 602 with a reflectivity of 90%, GaInNAs/GaAs single quantum well (SQW) active layer 603, and p-type GaAs/AlAs reflective layer 604 with a reflectivity of 90% are formed on the wafer of the buffer layer 502. In this LED, reflective layers 602 and 604 are provided to enhance its emission efficiency (i.e., to effectively take out much light in a desired direction).

Figure 7:
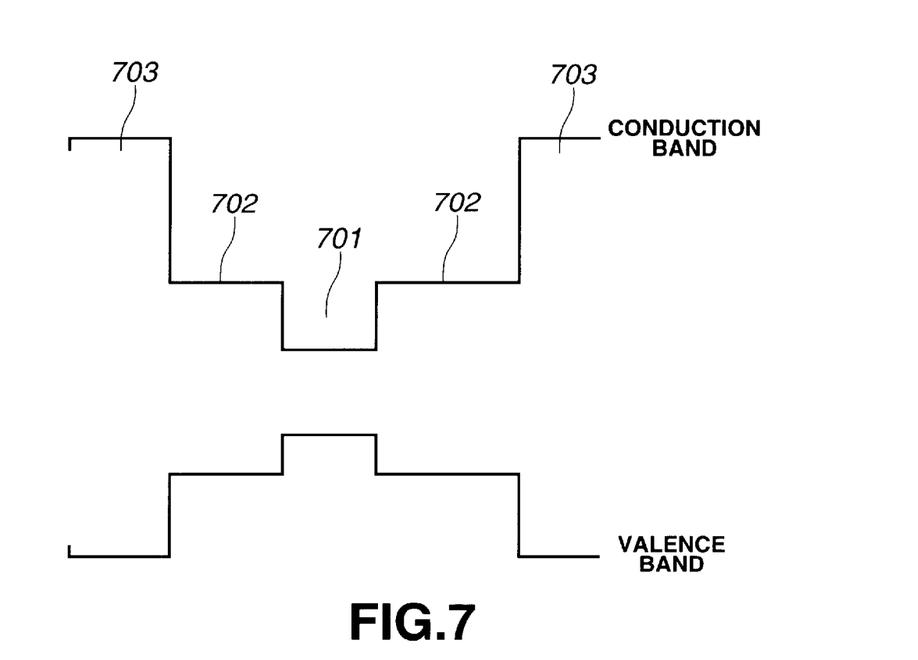
FIG. 7 is a view illustrating the energy band structure of an active layer in the LED.

FIG. 7 illustrates the energy band structure of the active layer 603 which includes a single well layer 701 sandwiched by barrier layers 702. The thickness of a cladding layer 703 is controlled such that the length of a cavity is equal to a radiation wavelength. Further, an AlAs layer of the p-type GaAs/AlAs reflective layer 604 is oxidized except for its central portion to construct a current confinement layer 605.

After growth of the above layers, positive and negative electrodes 606 and 607 are formed. Then, the IC 103 is connected to the electrodes 606 and 607 after the nitride layer is removed.

Since the light source of this embodiment is a surface emitting LED structure, light is emitted over a substantially whole angle. A spherical lens can be formed on this structure to enlarge the radiation angle. For example, the LED structure is formed after the (111) face and its equivalent faces are etched to lens shapes (e.g., a concave lens shape).

The light-receiving device can also be fabricated by a method similar to the above fabrication method of the light source. That is, crystal growth of the light-receiving device is conducted after adjustment of the lattice matching is achieved by a buffer layer. Those optical devices are fabricated at a time by the above selective growth technique (see FIG. 5), but the optical devices can also be separately fabricated.

The operation of the first embodiment will be described. A fundamental operation will be described first. In the light-emitting device of this embodiment, the distributed Bragg reflector (DBR) layers 602 and 604 and the active layer 603 of GaInNAs/GaAs are used. Therefore, the device can be driven at an operation current of 0.05 mA and an operation voltage of 1.5 V, and hence, the device can be directly driven by a logic signal of a CMOS circuit that operates at 1.5 V or more. Further, in the light-receiving device, a sufficient light-receiving sensitivity can be obtained by applying a reverse bias of about 1.5 V thereto.

The surface emitting LED and the surface receiving pin-PD are used, and therefore, light can be emitted over an entire angle and light from an entire angle can be received. This fact makes it possible to obtain a construction in which light from the LED located at any one of the (111) face and its equivalent faces (in total, eight faces) can be received by the light-receiving devices located at the other seven of those faces.

The flow of signals will be described. In FIG. 1, when an electric signal from the exterior of the ball IC is input into a processor element (PE) 103 consisting of CMOS and the like, the relevant operation is performed in the PE 103. Then, its output is supplied to another PE 103 through the electric wiring 104 or the optical wiring 105. The electric wiring 104 transmits the signal in the same way as an ordinary IC. In the optical wiring 105, light corresponding to the output from the PE 103 is emitted from the light-emitting device 102 into the Si ball 101 over a wide angle. The emitted light is received and converted into an electric signal by the light-receiving device 102.

The signal transmitted through the electric wiring 104 may control the light-receiving devices 102 such that light can be received only by a desired light-receiving device. The light-receiving sensitivity of a desired light-receiving device 102 can also be controlled. In the first embodiment, those operations and data transfer are basically performed in the Si ball 101 and on its surface.

In the first embodiment, electronic devices 103 and optical devices 102 are arranged on the Si ball 101, and therefore, those devices 102 and 103 can be effectively interconnected without any interference between the electric wiring 104 and the optical wiring 105.

Second Embodiment

A second embodiment is directed to an optoelectric integrated device in which VCSELs and PDs are arranged in a ball IC on a Si ball. Active layers of VCSELs are chiefly composed of GaInNAs, and active layers of the PDs are chiefly composed of GaInNAs or SiGe. Those materials are not lattice-matched to GaAs.

Figure 9:
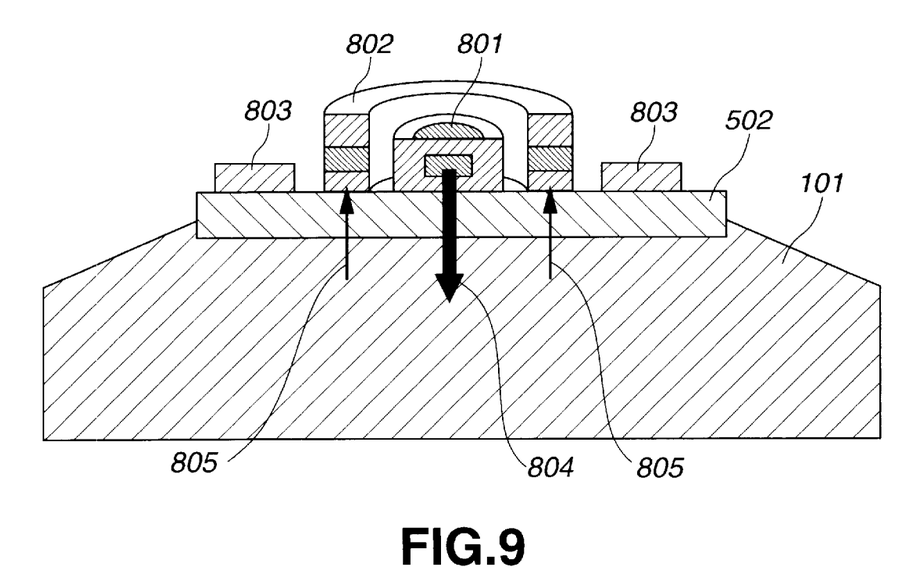
FIG. 9 is a view illustrating 1×1 light emission and reception in the second embodiment.

FIG. 9 illustrates the second embodiment. The second embodiment is different from the first embodiment in that the lattice constant of a buffer layer 502 is in a range between that of Si and that of GaAs, and VCSELs are used as a light source.

In FIG. 9, surface emitting laser (VCSEL) 801, pin-PD 802 with a ring-shaped light-receiving surface, and electrode pads 803 are formed on the buffer layer 502 on a spherical Si ball 101 having a diameter of about 1 mm. Light 804 is emitted from the VCSEL 801, and light 805 from another VCSEL is received by the pin-PD 802.

The second embodiment is fabricated in the following manner.

The ball IC is fabricated by the same method as that of the first embodiment. After the process of the Si ball IC is completed, optical devices are formed as follows.

The Si ball 101 is entirely covered with a nitride layer or the like, and a flat portion for forming an optical device thereon with a size of about 10 μm is formed by abrasion and chemical polishing. Here, the (001) face and its equivalent faces (in total, six faces) are used (see FIG. 8). As described in the first embodiment, the (111) face and its equivalent faces can also be used.

If necessary, the entire structure may be again covered with a nitride layer or the like, and a window is then opened only on an optical-device fabrication region. As described in the first embodiment, the structure is covered with the nitride layer to protect the electronic device and use the nitride layer as a mask for selective growth. In the second embodiment, an opening with a diameter of 5 μm is formed in the nitride layer.

Crystal growth of the optical device will be described. The buffer layer 502 of $GaN_xAs_{1-x}$ is laid down only on the face equivalent to the (001) face, using gas source MBE or MOCVD. Here, the nitrogen (N) mole fraction x is gradually changed from 0.2 to y (0.2>y>0). In this embodiment, y=0.05. After that, desired light source(s) and light-receiving device(s) are fabricated.

An example of the VCSEL will be described by using FIG. 6 again. As illustrated in FIG. 6, GaNAs buffer layer 502, n-type AlNAs/GaNAs reflective layer 602 with a reflectivity of 99.9%, undoped active layer 603, and p-type AlPAs/GaNAs reflective layer 604 of 99.99% are formed on the Si ball 101. The combination of AlPAs/GaNAs is used in the p-type reflective layer 604 to achieve the lattice matching between the reflective layer 604 and the GaNAs buffer layer 502, increase a refractive-index difference between the layers of AlPAs and GaNAs, and reduce the hetero-barrier in a valence band of the reflective layer 604. Further, the combination of AlNAs/GaNAs is used in the n-type reflective layer 602 to achieve the lattice matching between the reflective layer 602 and the GaNAs buffer layer 502, and reduce the hetero-barrier in a conduction band of the reflective layer 604. As a result, a highly-reflective layer can be formed with a small number of layers, and at the same time a series resistance due to the hetero-barrier can be reduced. Thus, VCSEL 801 capable of operating at small current and low voltage can be achieved.

The structure of the active layer 603 will be described by using FIG. 7 again. The active layer 603 is composed of a single GaInNAs well layer 701 with a thickness of 8 nm, a radiation wavelength of 1.35 μm and a strain of −0.5% (tensile strain), and InGaAs barrier layers 702 with a thickness of 10 nm and a strain of 0.5% (compressive strain) which sandwich the well layer 701. The radiation wavelength is set to about 1.3 μm. The strain may be controlled when necessary. An important point is that the active layer 603 is formed of III-VN and III-V semiconductor materials to obtain the radiation wavelength (e.g., 1.3 μm) longer than a wavelength of Si absorption edge such that the interior of the Si ball 101 can be used as an optical transmission line and achieve a large band-offset in the conduction band such that thermal characteristics of the VCSEL can be improved.

After the above crystal growth, positive electrode 606 and negative electrode 607 are formed. Then, the ball IC 103 is connected to the electrodes 606 and 607 after the nitride layer is removed.

Figure 8:
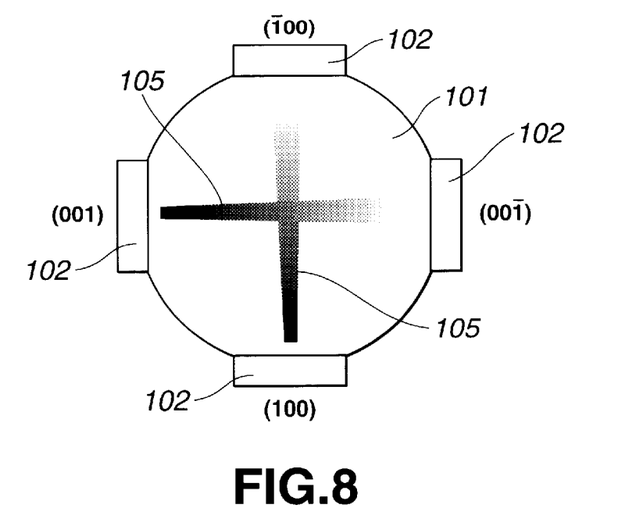
FIG. 8 is a cross-sectional view illustrating a second embodiment of the present invention at the fabrication stage at which optical devices are fabricated on flat portions of the Si ball for forming an optical device thereon.

The light-receiving device can also be fabricated by a method similar to the above fabrication method of the light source. Those optical devices can be fabricated at a time by the above selective growth technique (see FIG. 9), but the devices can be separately fabricated by the selective growth. FIG. 8 illustrates the latter example.

As described above, the active layer of the VCSEL 801 needs to be formed of III-VN and III-V semiconductor materials such that the interior of the Si ball 101 can be used as an optical transmission line, but the active layer of the light-receiving device 802 may be formed of SiGe such that light at a 1.3-μm band can be received thereby. When the active layer of the light-receiving device 802 is formed of SiGe, selective growths for the light source and the light-receiving device need to be separately performed.

The operation of the second embodiment will be described. In the VCSEL of this embodiment, the reflective layers and the active layer of III-VN semiconductor material are used. Therefore, the device can be driven at an operation current of 0.1 mA and an operation voltage of 1.5 V, and hence, the device can be directly driven by a logic signal from a CMOS circuit that operates at 1.5 V or more. Further, in the light-receiving device, a sufficient light-receiving sensitivity can be obtained by applying a reverse bias of about 1.5 V thereto.

In FIG. 1, when an electric signal from the exterior of the ball IC is input into a processor element (PE) 103 consisting of CMOS and the like, necessary processing is performed in the PE 103. Then, its output is supplied to another PE 103 through the electric wire 104 or optical path 105. The electric wire 104 transmits the signal in the same way as an ordinary IC. Different from the first embodiment, the optical directivity factor of the laser used in the second embodiment is high, and hence, the signal is transmitted only to a desired light-receiving device. For example, an optical signal emitted from the (001) face can be received only by the light-receiving device 102 on the (00–1) face as illustrated in FIG. 8. Alternatively, an optical signal emitted from the (100) face can be received only by the light-receiving device 102 on the (–100) face. The received signal is processed by the PE nearby, and transmitted through the electric wire 104 or optical wiring 105. Thus a desired processed result can be finally obtained. In such a manner, electric wiring 104 and optical wiring 105 can be organically connected.

Third Embodiment

A third embodiment is directed to an optoelectric integrated device in which a laser diode (LD) and a light emitting diode (LED) are used as a light source. The LED is used as a light source as in the first embodiment, and the LD is used as a light source as in the second embodiment. When necessary, both LED and LD can be used as in the third embodiment.

Figure 10:
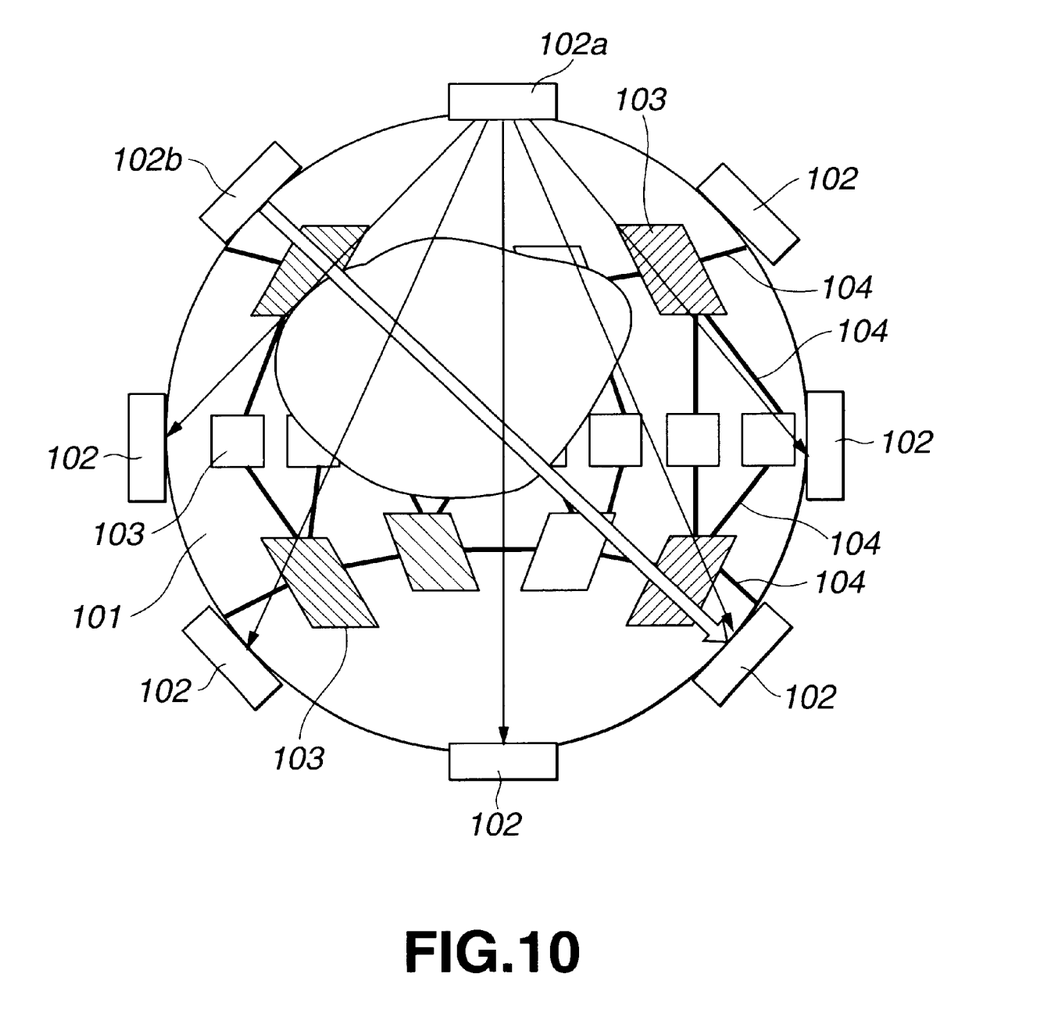
FIG. 10 is a view with a cut-away portion illustrating 1×1 and 1×N light emission and reception in a third embodiment according to the present invention.

FIG. 10 illustrates the third embodiment. In FIG. 10, reference numeral 102a is a light-emitting device for 1×N optical wiring. When the optical device as described in the first embodiment is used, an output from the PE can be converted into multiple outputs (i.e., fan-out). Reference numeral 102b is a light-emitting device for 1×1 optical wiring. When the optical device as described in the second embodiment is used, 1×1 optical wiring can be achieved. In the 1×1 optical wiring, high speed data transfer can be achieved though flexibility of the wiring is somewhat lowered compared to the 1×N optical wiring.

When desired, optical devices having both functions of the devices 102a and 102b can be arranged for a single PE. Thus, 1×1 connection and 1×N connection are possible in optical wiring, similarly to electric wiring, and totally N×N connection can be readily achieved. Accordingly, data processing speed can be drastically improved.

As described in the foregoing, in an optoelectric integrated device of the present invention, a light source and/or a light-receiving device (typically, IC and a plurality of light sources and light-receiving devices) are arranged on the surface of a solid semiconductor crystal, such as a Si ball, so that the interior of the semiconductor crystal can be used as a transmission line. Accordingly, wiring density and transfer capacity can be drastically increased.

Further, since the above optical transmission line is flexible and N×N connection can be readily achieved, the above-discussed pin-bottle-neck problem can be solved.

Furthermore, an optical device whose consumption electric power is very small can be fabricated, since a light radiation layer of GaAsN series can be readily laid down on the Si ball.

While the present invention has been described with respect to what are presently considered to be the preferred embodiments, it is to be understood that the invention is not limited to the disclosed embodiments. The present invention is intended to cover various modifications and equivalent arrangements included within the spirit and scope of the appended claims.

What is claimed is:

1. An optoelectric integrated device comprising:
    a three-dimensional solid semiconductor crystal; and
    a plurality of optical devices, including a light-emitting device and a light-receiving device, said optical devices being integrated on a surface of said semiconductor crystal,
    wherein light is emitted and received between said light-emitting device and said light-receiving device through an interior of said semiconductor crystal which is used as optical wiring medium.

2. The optoelectric integrated device according to claim 1, further comprising an electronic device, wherein said semiconductor crystal comprises a silicon (Si) ball, and said electronic device and said optical devices are integrated on a surface of said Si ball.

3. The optoelectric integrated device according to claim 2, wherein said optical device includes a portion composed of III-VN semiconductor material or IV semiconductor material.

4. The optoelectric integrated device according to claim 3, wherein said III-VN semiconductor material is selected from the group consisting of GaNAs, GaInNAs, AlNAs, and GaInNAsP.

5. The optoelectric integrated device according to claim 3, wherein said IV semiconductor material is SiGe.

6. The optoelectric integrated device according to claim 1, further comprising a buffer layer for lattice matching which is formed on the surface of said semiconductor crystal, wherein said optical devices are formed on said buffer layer.

7. The optoelectric integrated device according to claim 1, wherein said light-emitting device is constructed such that it emits spontaneous emission light or induced emission light into the interior of said semiconductor crystal, the light having a wavelength longer than a bandgap wavelength of said semiconductor crystal.

8. The optoelectric integrated device according to claim 7, wherein at least one said light-receiving device is arranged to receive the light emitted by said light-emitting device.

9. The optoelectric integrated device according to claim 1, wherein said light-emitting device is constructed such that it emits spontaneous emission light or induced emission light into an exterior of said semiconductor crystal.

10. The optoelectric integrated device according to claim 1, wherein said light-receiving device is arranged such that it receives light emitted into the interior of said semiconductor crystal by one or a plurality of said light-emitting devices.

11. The optoelectric integrated device according to claim 1, wherein said light-receiving device is arranged such that it receives light from an exterior of said semiconductor crystal.

12. The optoelectric integrated device according to claim 1, wherein said optical devices include plural such light-emitting devices and light-receiving devices, and wherein said light-emitting devices include a light-emitting device which can emit light into the interior of said semiconductor crystal toward a predetermined one of said light-receiving devices, and a light-emitting device which can emit light into the interior of said semiconductor crystal toward a plurality of predetermined ones of said light-receiving devices.

13. The optoelectric integrated device according to claim 1, further comprising an electronic device formed on the surface of said semiconductor crystal, said electronic device having at least one function selected from the group of switching on and off said light-emitting device, converting light received by said light-receiving device into an electric signal, and performing at least one arithmetic or logical operation on the basis of the electric signal.

14. An optoelectric integrated device comprising:
    a silicon (Si) ball;
    a plurality of optical devices, including a light-emitting device and a light-receiving device, said light-emitting device having an oscillation wavelength longer than a bandgap wavelength of said Si ball; and
    an electronic device, said electronic device having at least one function selected from the group of switching on and off said light-emitting device, converting light received by said light-receiving device into an electric signal, and performing at least one arithmetic or logical operation on the basis of the electric signal, and said optical devices and said electronic device being integrated on a surface of said Si ball,
    wherein light is emitted and received between said light-emitting device and said light-receiving device through an interior of said Si ball which is used as optical wiring medium.

15. An optoelectric integrated device comprising:
    a spherical semiconductor; and
    at least one of a light-emitting device for emitting signal light into an interior of said spherical semiconductor and a light-receiving device for receiving signal light transmitted through the interior of said spherical semiconductor.

* * * * *